US011069720B2

(12) United States Patent
Tao et al.

(10) Patent No.: US 11,069,720 B2
(45) Date of Patent: Jul. 20, 2021

(54) DISPLAY PANEL AND DISPLAY DEVICE

(71) Applicant: Shanghai Tianma AM-OLED Co., Ltd., Shanghai (CN)

(72) Inventors: Baosheng Tao, Shanghai (CN); Zhiyong Xiong, Shanghai (CN); Liyuan Liu, Shanghai (CN)

(73) Assignee: SHANGHAI TIANMA AM-OLED CO., LTD., Shanghai (CN)

( * ) Notice: Subject to any disclaimer, the term of this patent is extended or adjusted under 35 U.S.C. 154(b) by 0 days.

(21) Appl. No.: 16/669,546

(22) Filed: Oct. 31, 2019

(65) Prior Publication Data

US 2020/0144298 A1 May 7, 2020

(30) Foreign Application Priority Data

Jun. 27, 2019 (CN) .......................... 201910570426.3

(51) Int. Cl.
*H01L 27/12* (2006.01)
(52) U.S. Cl.
CPC ........ *H01L 27/124* (2013.01); *H01L 27/1218* (2013.01)

(58) Field of Classification Search
CPC .................................................. H01L 27/124
See application file for complete search history.

(56) References Cited

FOREIGN PATENT DOCUMENTS

| CN | 107749247 A | | 3/2018 |
|----|-------------|---|--------|
| CN | 107863374 A | | 3/2018 |
| CN | 108598139 A | | 9/2018 |
| CN | 108878453 A | | 11/2018 |
| CN | 109326631 A | * | 2/2019 |
| CN | 109326631 A | | 2/2019 |

* cited by examiner

*Primary Examiner* — Cuong Q Nguyen
*Assistant Examiner* — Peter M Albrecht
(74) *Attorney, Agent, or Firm* — Kilpatrick Townsend & Stockton, LLP

(57) ABSTRACT

Disclosed are a display panel and a display device, and the display panel includes a display area and a non-display area adjacent to the display area, the display area includes a first display area and a second display area, and the number of pixels in each column of pixels in the first display area is less than that of pixels in any column of pixels in the second display area.

16 Claims, 19 Drawing Sheets

DISPLAY PANEL AND DISPLAY DEVICE

CROSS-REFERENCE TO RELATED APPLICATION

This application claims priority of Chinese Patent Application No. 201910570426.3, filed on Jun. 27, 2019, which is hereby incorporated by reference in its entirety.

FIELD

The present disclosure relates to the field of display technology, in particular to a display panel and a display device.

BACKGROUND

With the development of display technology and people's higher requirements for display screen, special-shaped display screens are needed in some cases, such as circular display screens used in electronic watches, and full screens used to increase the screen ratio. In these cases, pixels in the special-shaped part of the display area can no longer be arranged in a rectangular array, so the number of pixels in each column is not necessarily the same, thereby the loads (RC) of data lines used to provide data signals to different columns are no longer the same.

SUMMARY

Firstly, the display panel provided in the embodiments of the present disclosure comprises a display area and a non-display area adjacent to the display area, and the display area includes a first display area and a second display area;
the first display area and the second display area includes a plurality of pixels arranged in an array, a plurality of data lines extending in a column direction and arranged in a row direction, and a plurality of fixed potential signal lines extending in the column direction and arranged in the row direction, with the row direction being perpendicular to the column direction; the data lines and the fixed potential signal lines are arranged in a same layer, and a quantity of pixels in each column of pixels in the first display area is less than that of pixels in any column of pixels in the second display area;
the first display area further includes compensation lines, and the compensation line and the fixed potential signal lines are electrically connected and arranged in different layers, the compensation lines and the data lines are insulated from each other, and there is an overlapping area between each of the compensation lines and each of the data lines in the direction perpendicular to the display panel.

In one possible embodiment, in the display panel provided in the embodiments of the present disclosure, the first display area includes at least a first column of pixels and a second column of pixels with different quantity of pixels, and a quantity of pixels in the first column of pixels is less than a quantity of pixels in the second column of pixels;

There is a first overlapping area between a data line and a compensation line corresponding to the first column of pixels, and there is a second overlapping area between a the data line and a compensation line corresponding to the second column of pixels;
the first overlapping area is larger than the second overlapping area.

In one possible embodiment, in the display panel provided in the embodiments of the present disclosure, when all compensation lines have a same length in the column direction, a width of the compensation line in the row direction in the first overlapping area is larger than that of the compensation line in the row direction in the second overlapping area.

In one possible embodiment, in the display panel provided in the embodiments of the present disclosure, when all compensation lines have a same width in the row direction, a length of the compensation line in the column direction in the first overlapping area is longer than a length of the compensation line in the column direction in the second overlapping area.

In one possible embodiment, in the display panel provided in the embodiments of the present disclosure, a width of the data line in the row direction in the first overlapping area is larger than that of the data line in the row direction in the second overlapping area.

In one possible embodiment, in the display panel provided in the embodiments of the present disclosure, a width of the data line in the non-overlapping area is smaller than that of the same data line in the overlapping area.

In one possible embodiment, in the display panel provided in the embodiments of the present disclosure, an insulating layer is arranged between a layer where the compensation line is located and a layer where the data line is located;
each of the compensation lines is electronically connected with a corresponding fixed potential signal lines through a through-hole in the insulating layer.

In one possible embodiment, in the display panel provided in the embodiments of the present disclosure, the fixed potential signal lines include a power supply voltage signal line.

In one possible embodiment, in the display panel provided in the embodiments of the present disclosure, at least part of an edge of the first display area is a curved edge, a fillet, a chamfer or a notch, and the columns of pixels in the first display area extend to the curved edge, the fillet, the chamfer or the notch.

In one possible embodiment, in the display panel provided in the embodiments of the present disclosure, the first display area includes a notch or a hollow section, and the columns of pixels in the first display area extend to the notch or the hollow section.

Secondly, embodiments of the present disclosure provide a display device including a display panel provided in any of the embodiments.

DETAILED DESCRIPTION OF THE EMBODIMENTS

Figure 1:
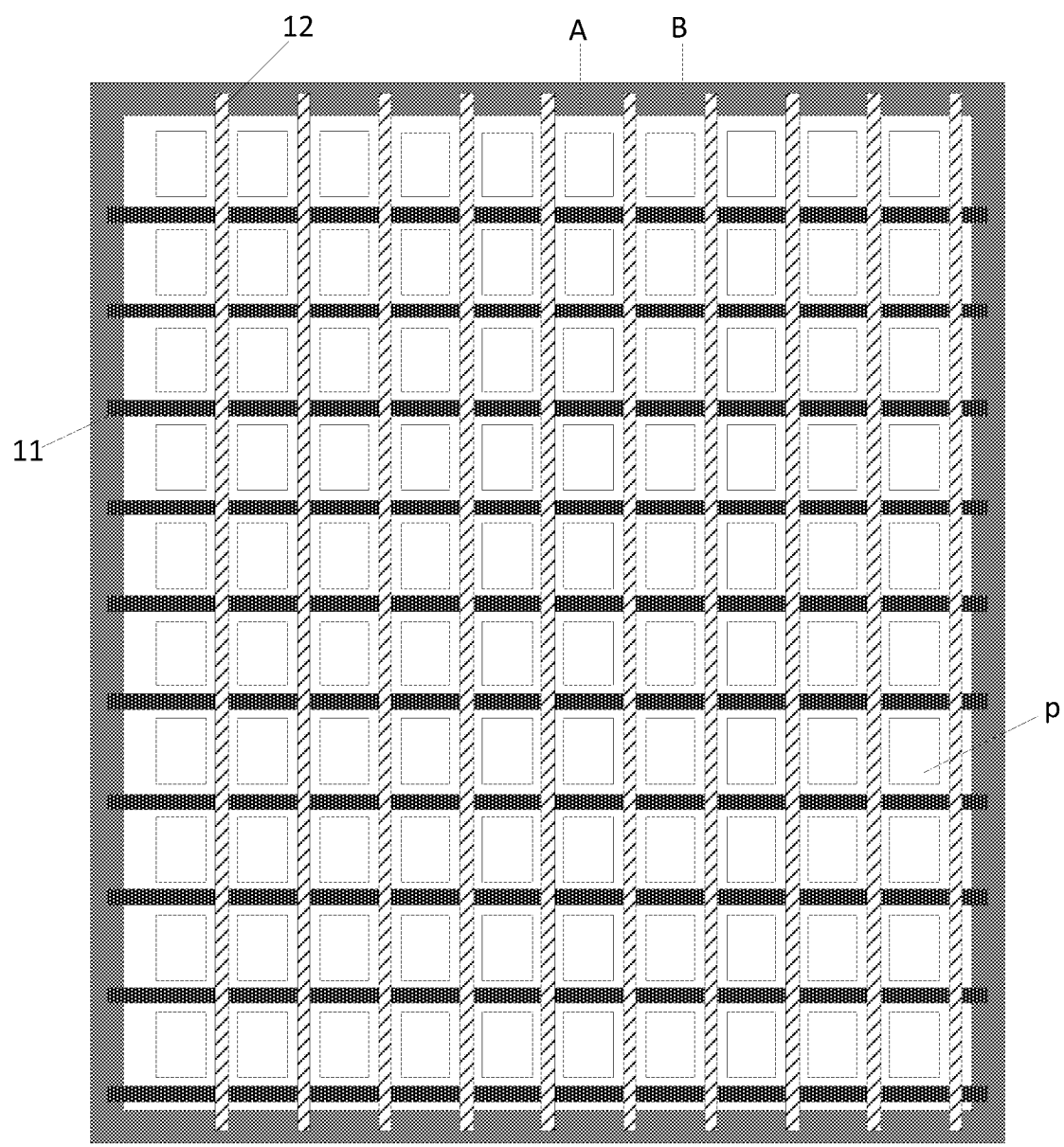
FIG. 1 is a schematic diagram of the planar structure of a non-special-shaped display screen in the related technology.

The display panel in the related technology, as shown in FIG. 1, includes a display area A for displaying images, and a non-display area B for arranging a surrounding driving circuit, etc. The array-distributed pixels P in the display area A are respectively connected through switching elements (not specifically shown in the figure) with the driving circuit (not specifically shown in the figure) in the non-display area B, and each switching element is connected with a scan line 11 and a data line 12. A scan signal of the scan line 11 is received to turn on the switching element, and a data signal of the data line 12 is received to drive the pixel P to display a certain gray scale. The switching elements corresponding to different pixels P are connected with different combinations of the scan line 11 and the data line 12, so that each pixel P can emit light independently. At present, the display area A of the common display panel is a regular rectangle. Therefore, the number of pixels P connected with the same data line is the same, and data signals are provided by one data line 12 to the corresponding pixels P at different times.

Figure 2:
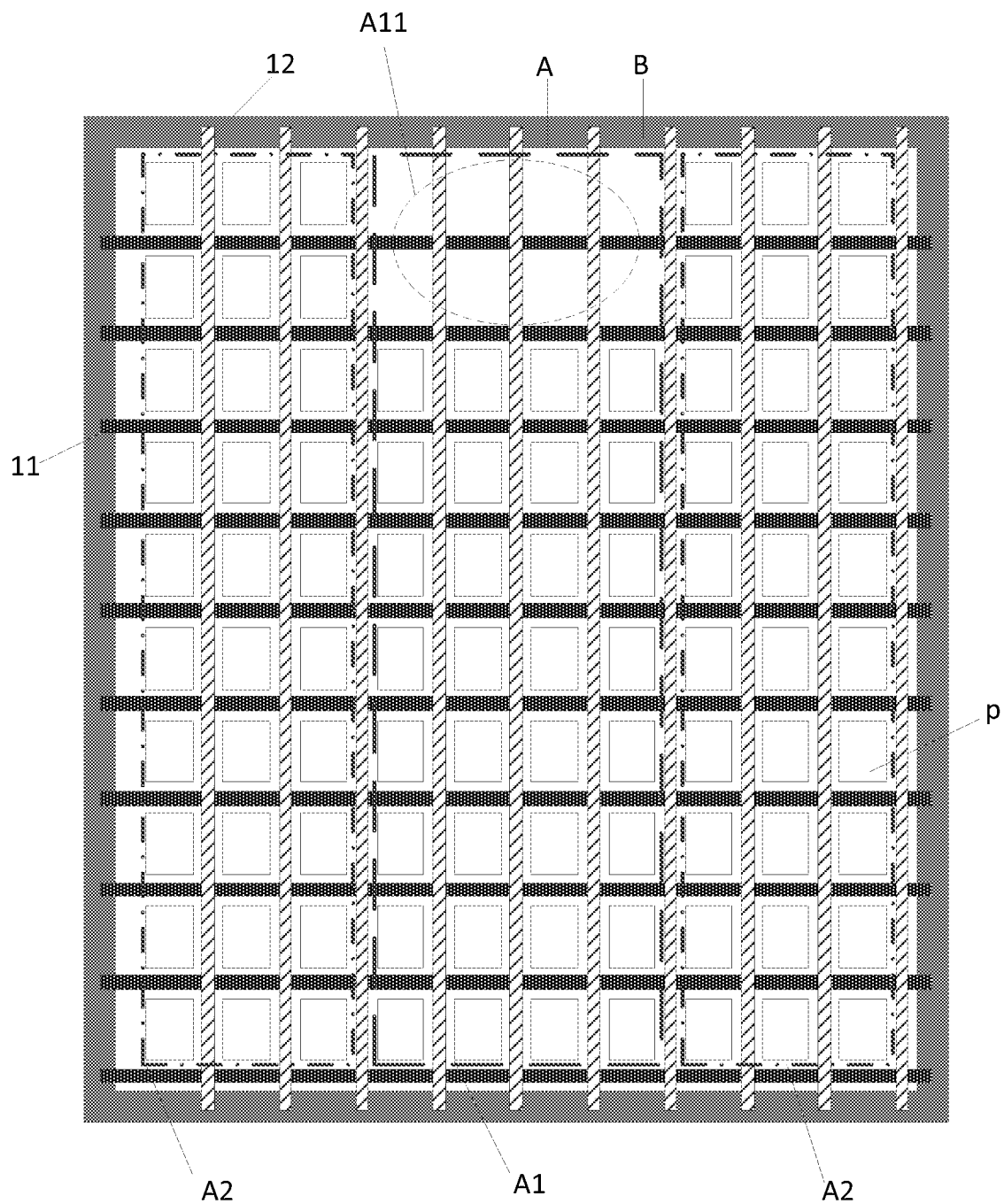
FIG. 2 is a schematic diagram of the planar structure of a special-shaped display screen in the related technology.

However, the development of display technology has brought higher requirements for display panels. In some cases, irregularly-rectangular special-shaped display panels are needed. As shown in FIG. 2, in order to increase the screen ratio to achieve full screen display, the non-display area B of the display panel occupies a very small area, so it is impossible to arrange such components as a camera, an earphone and a photosensitive element in the non-display area B. Therefore, an area A11 should be reserved for these elements in the display area A. There is no doubt that the pixel P may not be arranged in the area A11 where these elements are located, which causes the number of pixels P connected with the data line 12 in the first display area A1 less than that of pixels P connected with the data line 12 in the second display area A2, that is, the loads of the data lines 12 in the display area A are inconsistent, which leads to the poor display uniformity.

Figure 3:
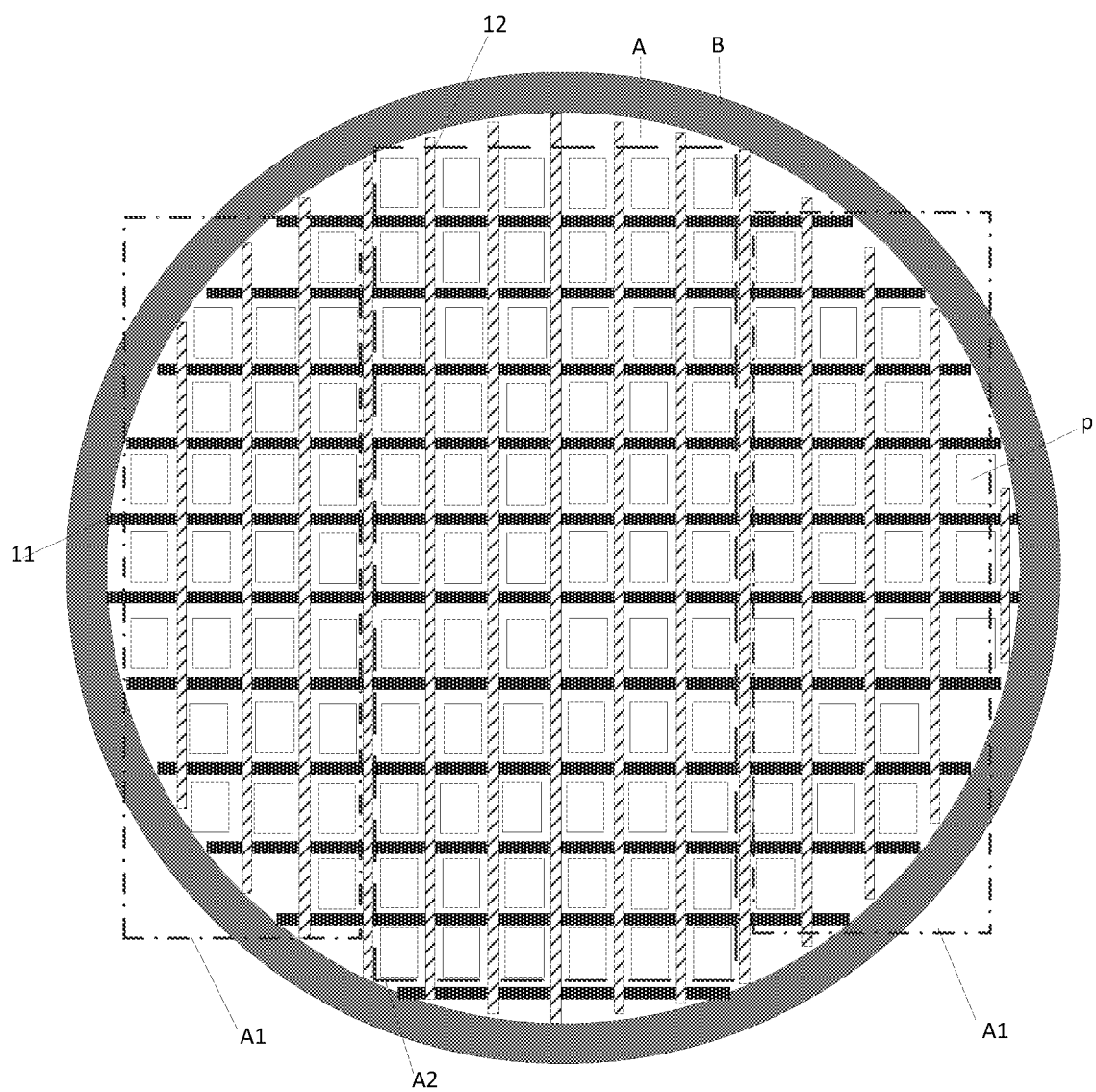
FIG. 3 is a schematic diagram of the planar structure of another special-shaped display screen in the related technology.

As the circular display panel which can be applied to electronic watches shown in FIG. 3, due to the particularity of the circle shape, the number of pixels P connected with the data line 12 in the second display area A2 is the largest, that is, the number of pixels P connected with the data line 12 in the area where the diameter is located is the largest, and the number of pixels P connected with the data line 12 in the first display area A1 extending in the direction away from the diameter is decreased gradually, which results in different numbers of pixels P connected with data lines 12 in the whole display area A and leads to the poor display uniformity of the display panel.

In summary, the pixels in the special-shaped part of the display area can no longer be arranged in an rectangular array, so the number of pixels in each column is not necessarily the same, and the loads (RC) of data lines used to provide data signals to different columns are no longer the same, which leads to the inconsistent brightness in the special-shaped and non-special-shaped areas when data lines in both areas provide same data signals. As a consequence, the display uniformity of the special-shaped display panel is poor and the display effect is not ideal.

In view of the problems existing in the related technology, the embodiments of the present disclosure provide a display panel and a display device to improve the uniformity of the display brightness and optimize the display effect.

The display panel and display device provided in the embodiments of the present disclosure are described in detail below in conjunction with the accompanying drawings.

Figure 4:
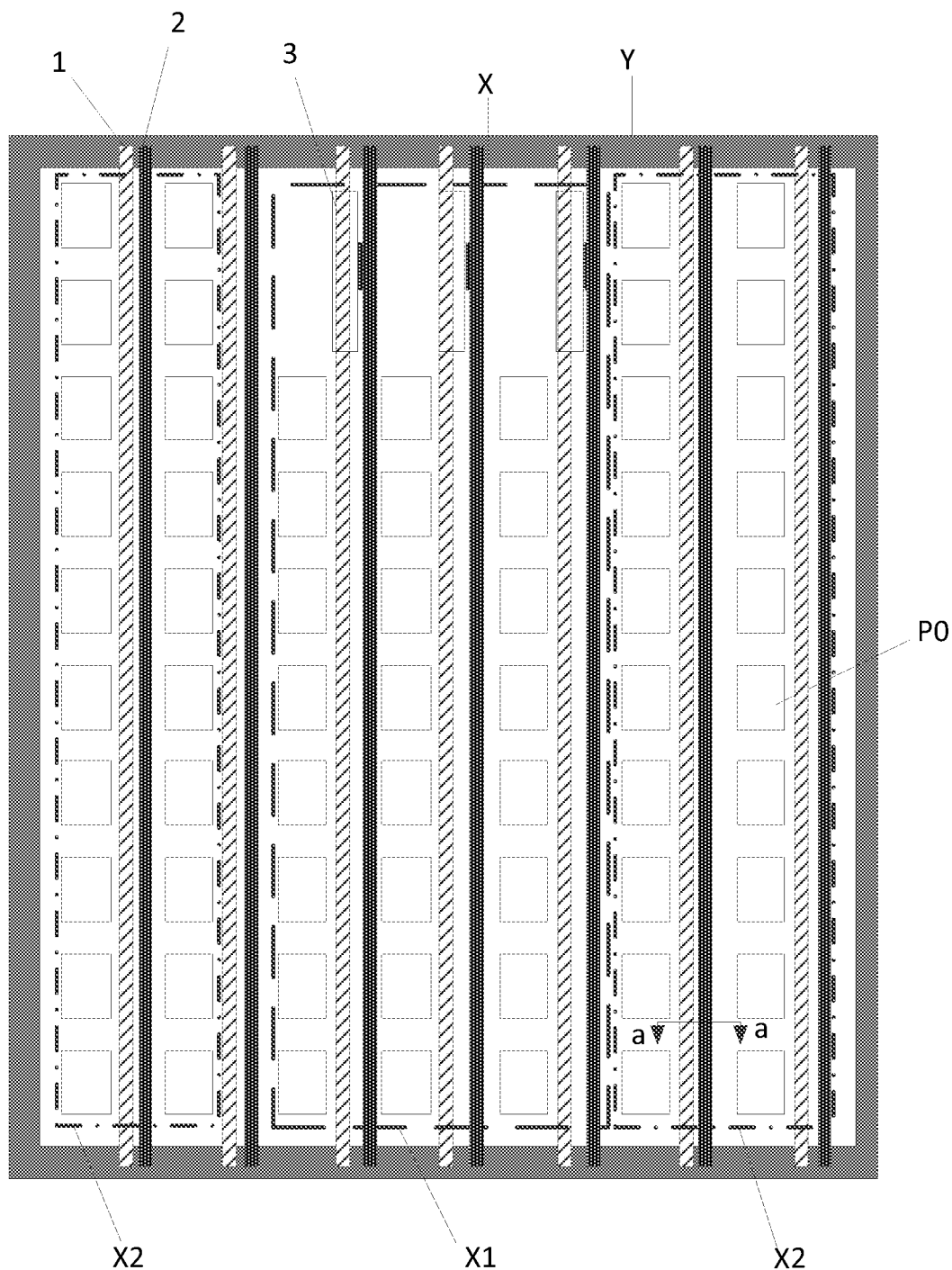
FIG. 4 is the first schematic diagram of the planar structure of the display panel provided by some embodiments of the present disclosure.
Figure 5:
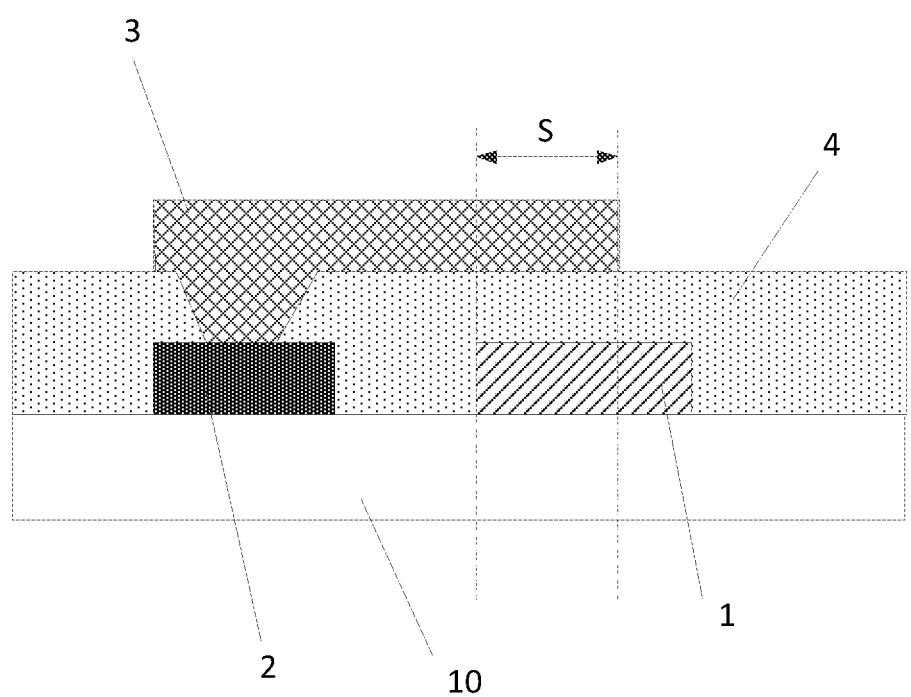
FIG. 5 shows the section structure of the display panel along a-a direction provided in FIG. 4.

As shown in FIGS. 4 and 5, the display panel provided in the embodiments of the present disclosure includes: a display area X and a non-display area Y adjacent to the display area X, and the display area X includes: a first display area X1 and a second display area X2;

each of the first display area X1 and the second display area X2 includes a plurality of pixels P0 arranged in an array, a plurality of data lines extending in the column direction and arranged in the row direction and a plurality of fixed potential signal lines 2 extending in the column direction and arranged in the row direction, with the row direction being perpendicular to the column direction; the data lines 1 and the fixed potential signal lines 2 are arranged in the same layer, and the number of pixels in each column of pixels P0 in the first display area X1 is less than that of pixels in any column of pixels P0 in the second display area X2.

The first display area X1 also includes: compensation lines 3, and the compensation lines 3 and the fixed potential signal lines 2 are electrically connected and are arranged in different layers, the compensation lines 3 are insulated from the data lines 1, and there is an overlapping area between the compensation lines 3 and the data lines 1 in the direction perpendicular to the direction of the display panel.

In practical applications, the conventional display panel is rectangular, and a plurality of pixels are arranged in an array, source driving circuits are arranged in the non-display area on both sides of the display panel, and the source driving circuit provides a corresponding data signal to each data line. In the conventional display panel, the number of pixels in one column of pixels connected with each data line is equal. In the actual production process, the data line will pass through the non-open area of a column of pixels, so the resistance of the data line itself and the resistance and capacitance between the data line and the elements such as transistors in the pixels will become the load of the data line. In order to meet some special requirements, the display panel may be designed into a non-rectangular shape. Then, part of pixels in the pixel array of the display panel will be cut off at the edges, interior and other positions, which results in the unequal number of pixels contained in each column of pixels. At this time, the loads of data lines connecting each column of pixels will be different because of the unequal number of pixels, so when the same data signal is loaded, there are also differences among the signals input to each column of pixels, which leads to the poor display uniformity.

Based on the above, the display panel provided in the embodiments of the present disclosure divides the display area into a first display area and a second display area, and the number of pixels in any column of pixels in the first display area is less than the number of pixels in each column of pixels in the second display area, which results in that the loads of the data lines in the first display area are less than those of the data lines in the second display area. Now, stray capacitance will be formed between the data lines and the compensation lines arranged in different layers to increase the loads of the data lines connecting fewer pixels, compensate for the load gap between the data lines, and improve the poor display uniformity of the display panel; at the same time, the compensation lines are electronically connected with the fixed potential signal lines to enlarge the area of the fixed potential signal lines and reduce the voltage drop of the fixed potential signal lines.

Figure 6:
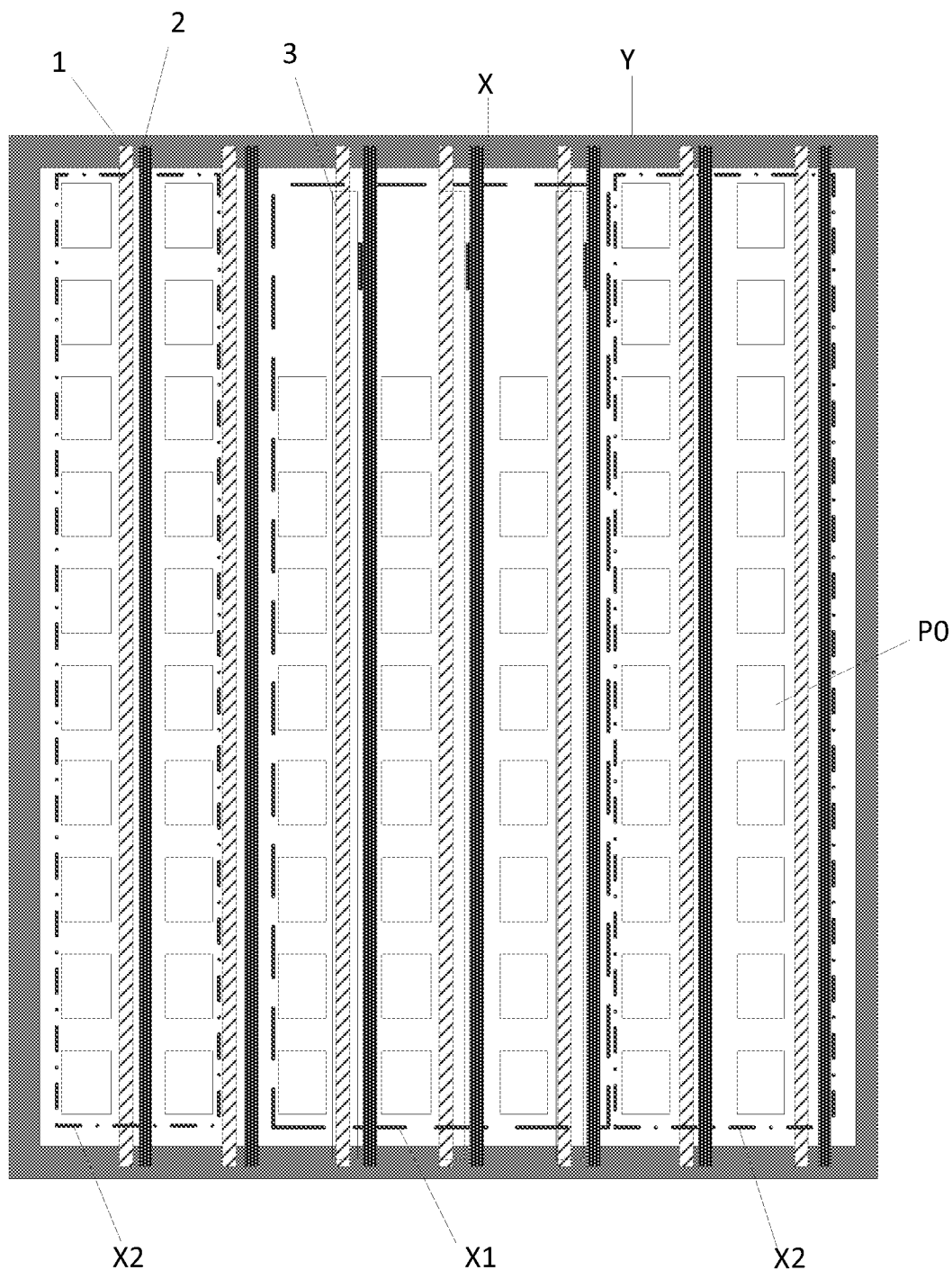
FIG. 6 is the second schematic diagram of the planar structure of the display panel provided in some embodiments of the present disclosure.

It should be noted that the overlapping area between the compensation line 3 and the data line 1 is determined according to the load that each data line 1 needs to be compensated, as shown in FIG. 4, only part of the area of the data line 1 is covered, or all the area of the data line 1 is covered, as shown in FIG. 6, there is no specific restriction here.

Figure 7:
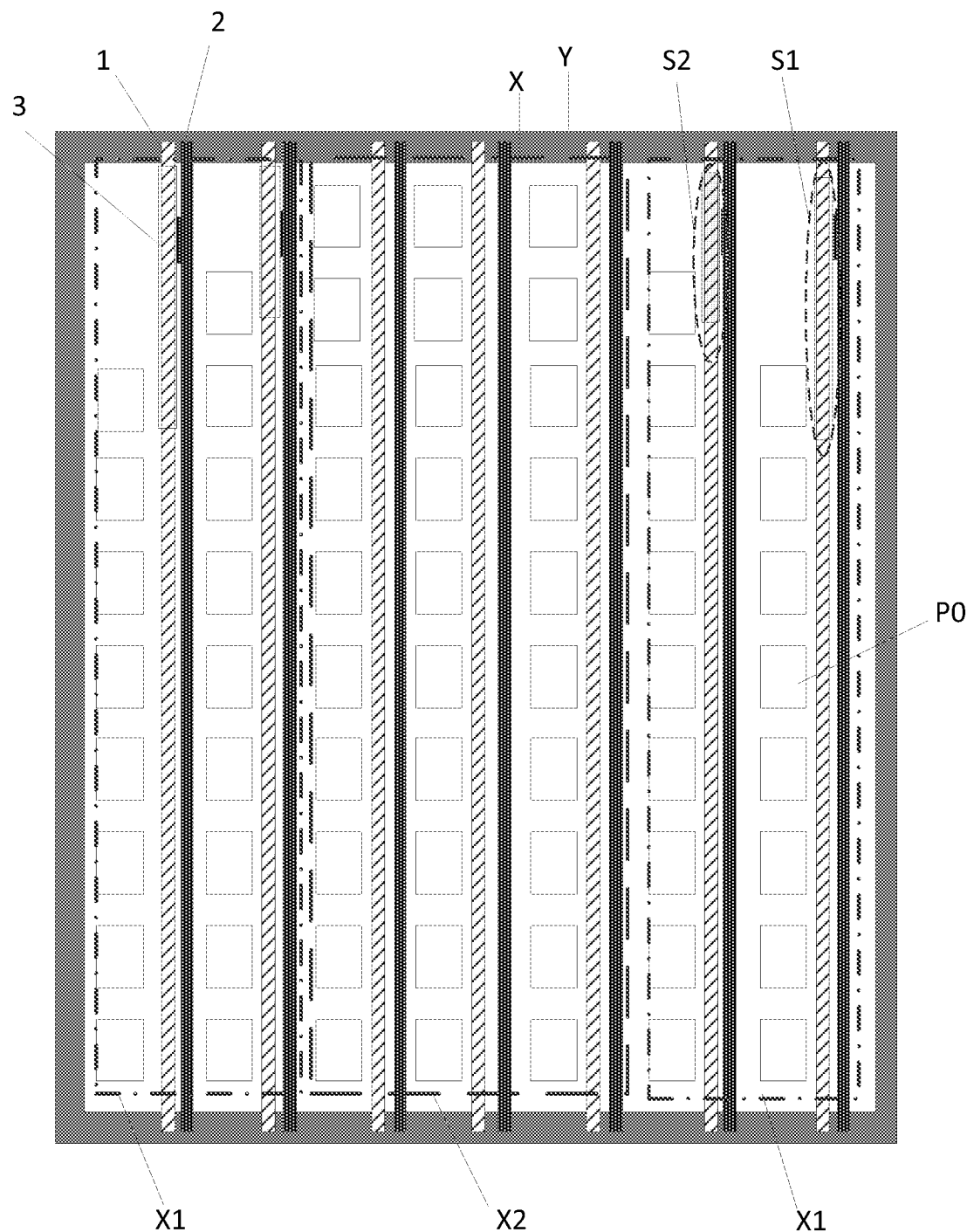
FIG. 7 is the third schematic diagram of the planar structure of the display panel provided in some embodiments of the present disclosure.
Figure 8:
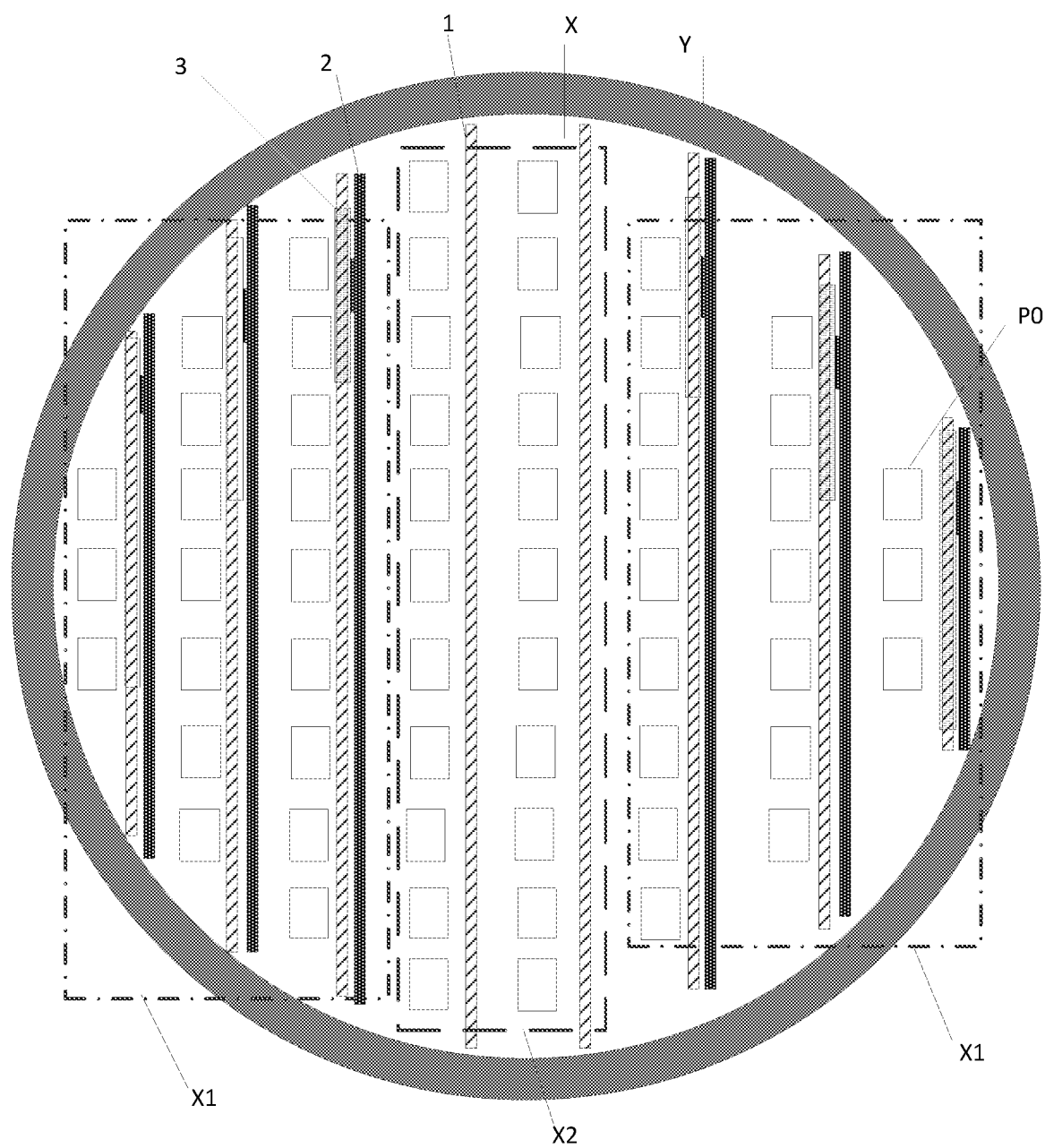
FIG. 8 is the fourth schematic diagram of the planar structure of the display panel provided in some embodiments of the present disclosure.

In one embodiment, in the display panel provided in some embodiments of the present disclosure, as shown in FIGS. 7 and 8, the first display area X1 includes at least: a first column of pixels and a second column of pixels with different numbers of pixels, and the number of pixels in the first column of pixels is less than the number of pixels in the second column of pixels;

the data line 1 and the compensation line 3 corresponding to the first column of pixels have a first overlapping area S1, and the data line 1 and the compensation line 3 corresponding to the second column of pixels have a second overlapping area S2;

the area of the first overlapping area S1 is larger than that of the second overlapping area S2.

In one embodiment, in the display panel provided in the embodiments of the present disclosure, as shown in FIG. 7, the area where the four corners of the display panel are located may also be provided with elements such as a camera, which may cause the numbers of pixels P0 connected with the data lines 1 in the first display area X1 different, such as the number of pixels in the first column of pixels is less than that of pixels in the second column of pixels, and also cause the load of the data line 1 connected with the first column of pixels less than that of the data line 1 connected with the second column of pixels. The overlapping areas between the data lines 1 and the compensation lines 3 can be controlled to compensate for the load difference of the data lines 1 in the first display area X1. The larger the overlapping area is, the larger the stray capacitance and the load compensation for the data line 1 will be. Therefore, increasingly needed load compensation for the data line 1 can be realized by enlarging the overlapping area between the data line 1 and the corresponding compensation line 3.

In one embodiment, in the display panel provided in the embodiments of the present disclosure, as shown in FIG. 8, when the display panel is circular, the data lines 1 in the first display area X1 farther away from those in the second display area X2 have the fewer number of pixels P0 connected. Thus, the overlapping areas between the data lines 1 and the compensation lines 3 can be adjusted to more accurately compensate for the loads of the data lines 1 in the first display area X1. The larger the overlapping area between the data line 1 and the compensation line 3 farther away from the second display area X2 is, the larger the stray capacitance formed with the data line 1 will be and the more the load compensation on the data line 1 will be, so that the load gap between the data lines 1 can be reduced.

Figure 9:
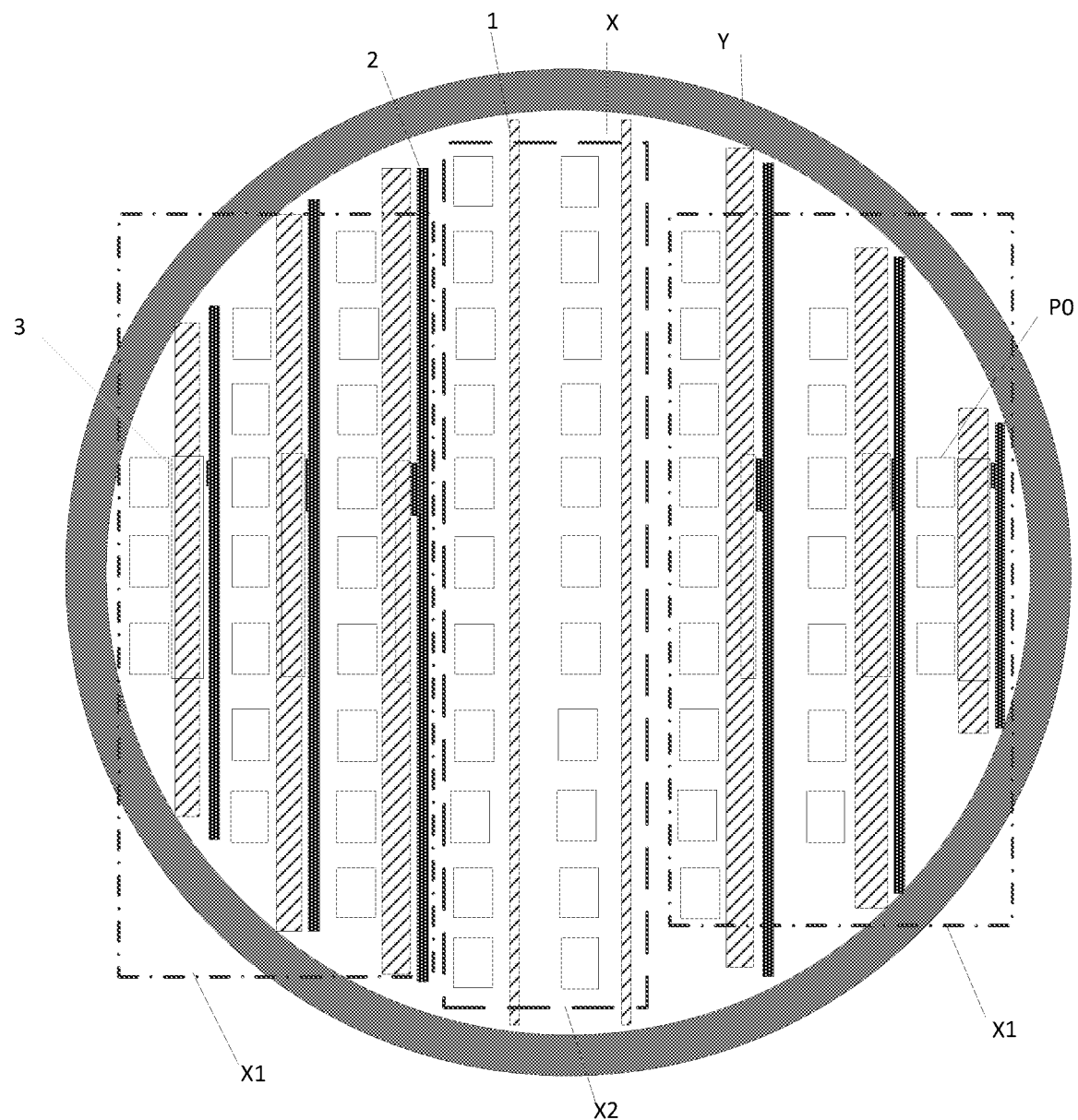
FIG. 9 is the fifth schematic diagram of the planar structure of the display panel provided in some embodiments of the present disclosure.

In one embodiment, in the display panel provided in the embodiments of the present disclosure, as shown in FIG. 9, when all the compensation lines 3 have the same length in the column direction, the width of the compensation line 3 in the first overlapping area in the row direction is larger than that of the compensation line 3 in the second overlapping area in the row direction.

In one embodiment, in the display panel provided in the embodiments of the present disclosure, as shown in FIG. 9, keeping the lengths of the compensation lines 3 the same in the column direction while increasing the widths of the compensation lines 3 in the row direction will create more overlapping areas between the compensation lines 3 and the data lines 1 in the row direction, which causes the overlapping areas between the data lines 1 with successively decreasing number of connected pixels and the compensation lines 3 to increase successively to compensate for the load gap between the data lines 1.

Figure 10:
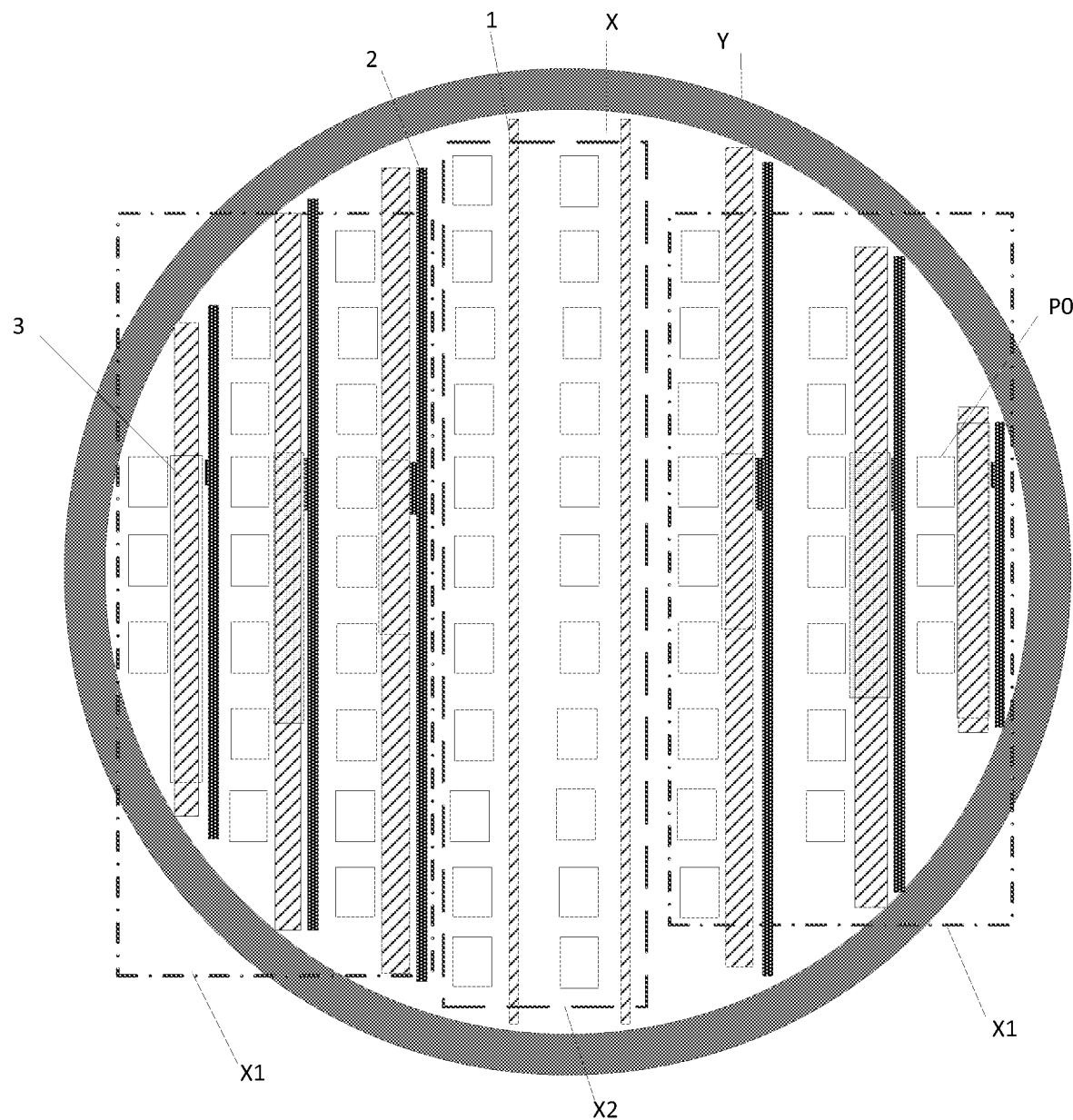
FIG. 10 is the sixth schematic diagram of the planar structure of the display panel provided in some embodiments of the present disclosure.

In one embodiment, in the display panel provided in the embodiments of the present disclosure, as shown in FIG. 10, when all the compensation lines 3 have the same width in the row direction, the length of the compensation line 3 in the first overlapping area in the column direction is longer than that of the compensation line 3 in the second overlapping area in the column direction.

In one embodiment, in the display panel provided in the embodiments of the present disclosure, the overlapping area between the compensation line 3 and the data line 1 can also be changed by adjusting the length of the compensation line 3 in the column direction while fixing the width of the overlapping area between the compensation line 3 and the data line 1 in the row direction. Taking the circular display panel shown in FIG. 10 as an example, when the widths of the overlapping areas between the compensation lines 3 and the data lines 1 are equal, the farther away the data line 1 from the second display area X2 is, the longer the length of the compensation line 3 corresponding to the data line 1 in the column direction is, so as to ensure that the overlapping area between the data line 1 and the compensation line 3 farther away from the second display area X2 is larger, and the load gap between the data lines 1 is reduced.

Figure 11:
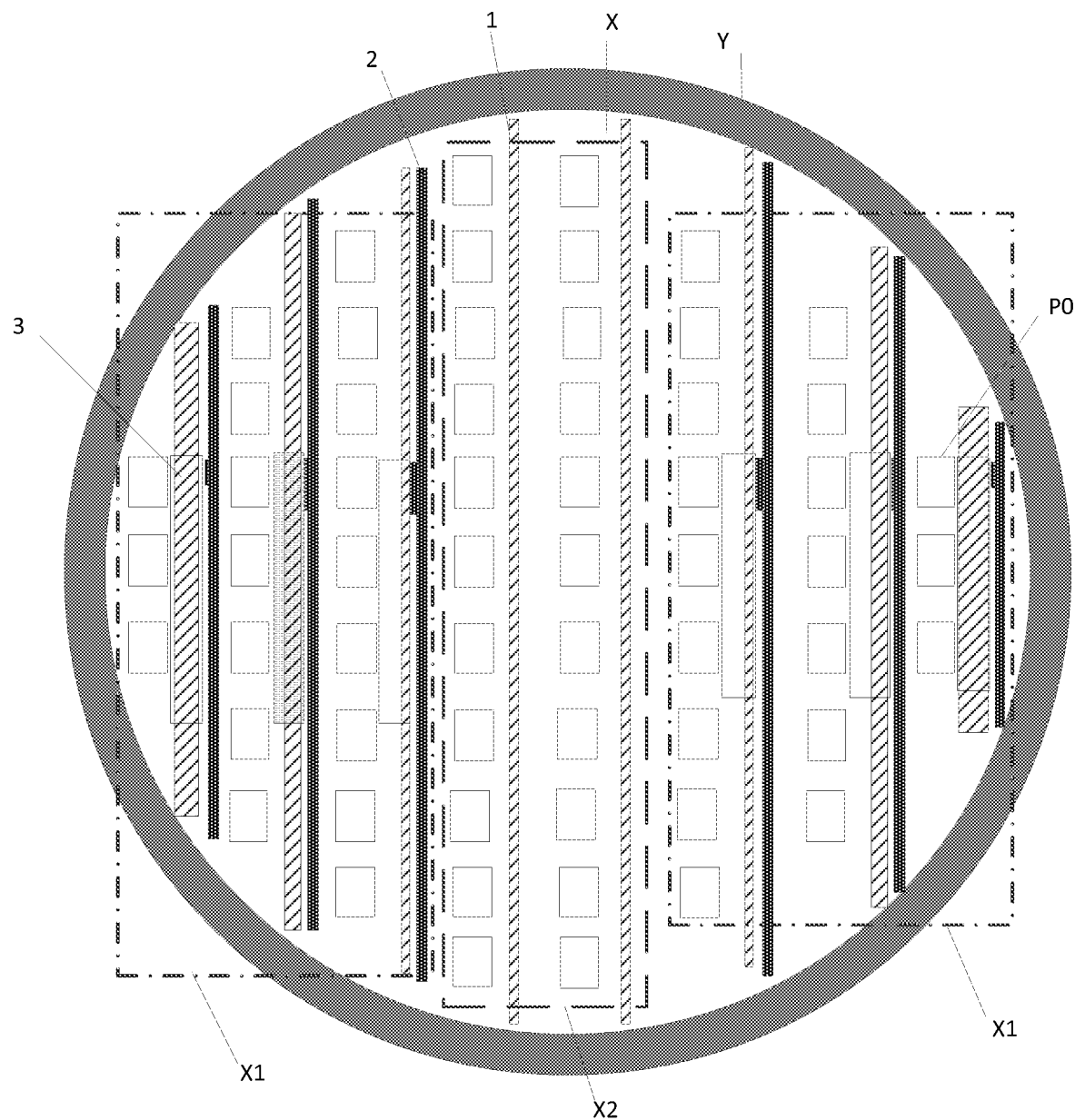
FIG. 11 is the seventh schematic diagram of the planar structure of the display panel provided in some embodiments of the present disclosure.

In one embodiment, in the display panel provided in the embodiments of the present disclosure, as shown in FIG. 11, the width of the data line 1 in the first overlapping area in the row direction is larger than that of the data line 1 in the second overlapping area in the row direction.

In one embodiment, in the display panel provided in the embodiments of the present disclosure, as shown in FIG. 11, when the width of the compensation line 3 in the row direction is larger than that of the data line 1 in the row direction, and the length of the compensation line 3 is fixed, the wider the data line 1 is, the larger the overlapping area between the data line 1 and the compensation line 3 will be, so that the overlapping area between data line 1 and compensation line 3 can be changed by adjusting the width of the data line 1 in the row direction.

Figure 12:
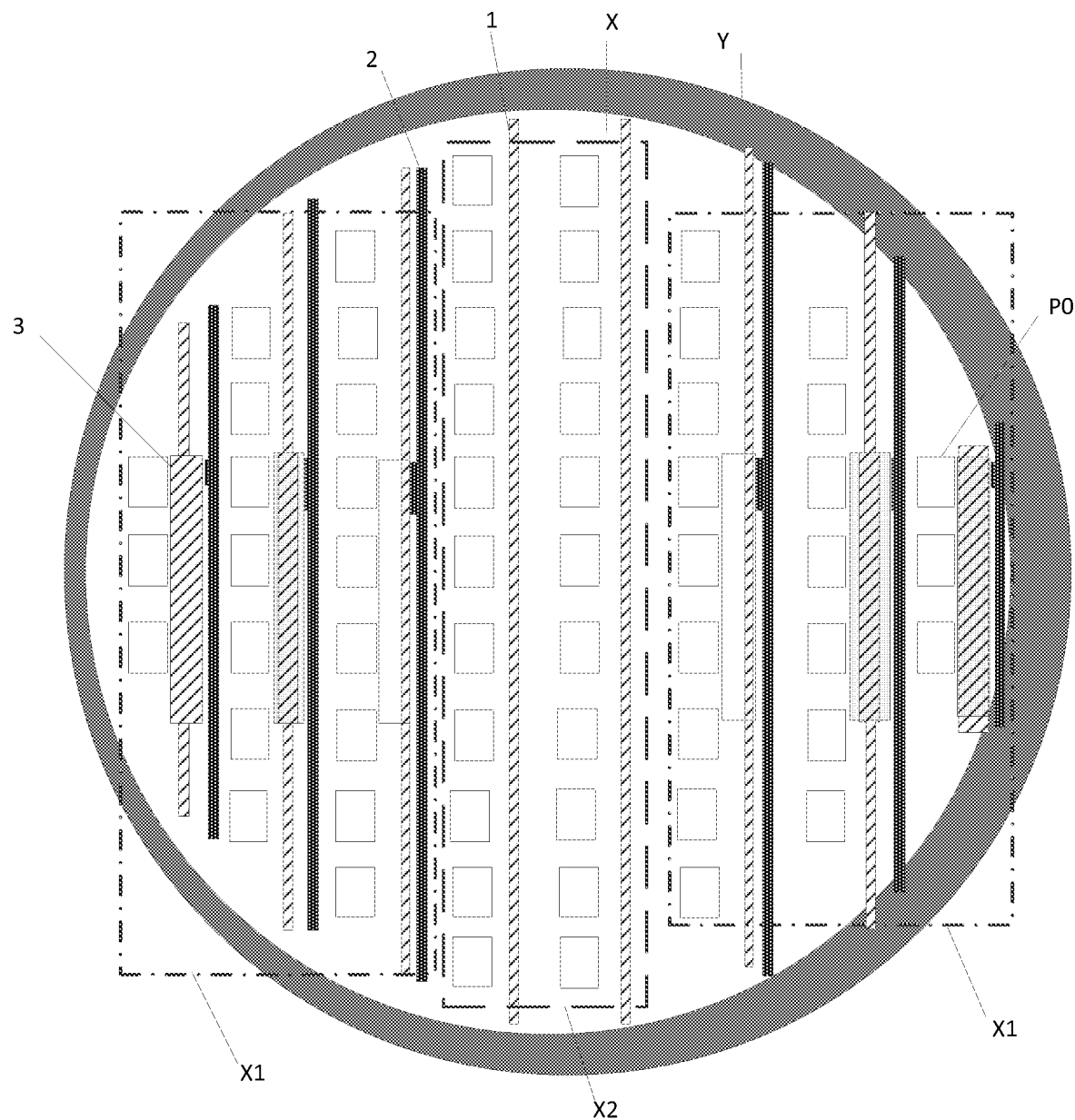
FIG. 12 is the eighth schematic diagram of the planar structure of the display panel provided in some embodiments of the present disclosure.

In one embodiment, in the display panel provided in the embodiments of the present disclosure, as shown in FIG. 12, the width of a data line 1 in the non-overlapping area is less than that of the same data line 1 in the overlapping area.

In one embodiment, in the display panel provided in the embodiments of the present disclosure, when the overlapping area between the data line and the compensation line is changed by adjusting the width of the data line in the embodiments, the data line sometimes needs to be wide, but if the whole data line has the same width, the occupied display area is large. Thus, in order to maintain the aperture ratio of the display area, the data line can be formed with only the overlapping area part between the data line and the compensation line having the required width and the width of the rest part meeting the transmission requirement of the data line signal.

It should be noted that, as shown in FIG. 12, when the overlapping area between the data line 1 and the compensation line 3 is changed by adjusting the width of the data line 1, if the width of the data line 1 itself in the row direction is small enough (the data line 1 next to the second display area X2 on the left side), or the length of the data line 1 in the column direction is already almost short to be fully covered by the compensation line 3 (the data line 1 next to the display panel frame on the right side), there is no need to adjust the width of the data line in the overlapping area in the row direction. The specific adjustment mode will be taken according to the size required in actual cases, and there is no specific restriction here on the specific adjustment mode and the required size.

In one embodiment, in the display panel provided in the embodiments of the present disclosure, as shown in FIG. 5, an insulating layer 4 is arranged between the layer where the compensation line 3 is located and the layer where the data line 1 is located;

the compensation line 3 is electrically connected with the fixed potential signal line 2 through a through-hole in the insulating layer 4.

In one embodiment, in the display panel provided in the embodiments of the present disclosure, as shown in FIG. 5, the display panel includes an array substrate 10, and the data lines 1 and the fixed potential signal lines 2 located on the array substrate 10, and the fixed potential signal line 2 and the data line 1 are arranged in the same layer, and can be formed by a single communication process. Different shadows are used to mark the lines in FIG. 5 for differentiation. The insulating layer 4 arranged between the compensation line 3 and the data line 1 is also included. The thicker the insulating layer 4 is, the larger the stray capacitance formed between the data line 1 and the compensation line 3 will be, and the thickness of the display panel will be certainly increased accordingly. The specific thickness of the insulating layer 4 should be considered comprehensively according to the actual demand, and there is no specific restriction here.

In one embodiment, in the display panel provided in the embodiments of the present disclosure, the fixed potential signal line includes a power supply voltage signal line.

In the process of making the pixel circuit, the power supply voltage signal line and the data line are arranged in the same layer, and fixed potential is applied. Therefore, the power supply voltage signal line can be selected to simplify the preparation technology by only arranging one insulating layer on the data line and arranging the compensation line on the insulating layer to electronically connect the compensation line and the power supply voltage signal line. Of course, it can also be replaced by other fixed potential signal lines, and there is no specific restriction here.

Figure 13:
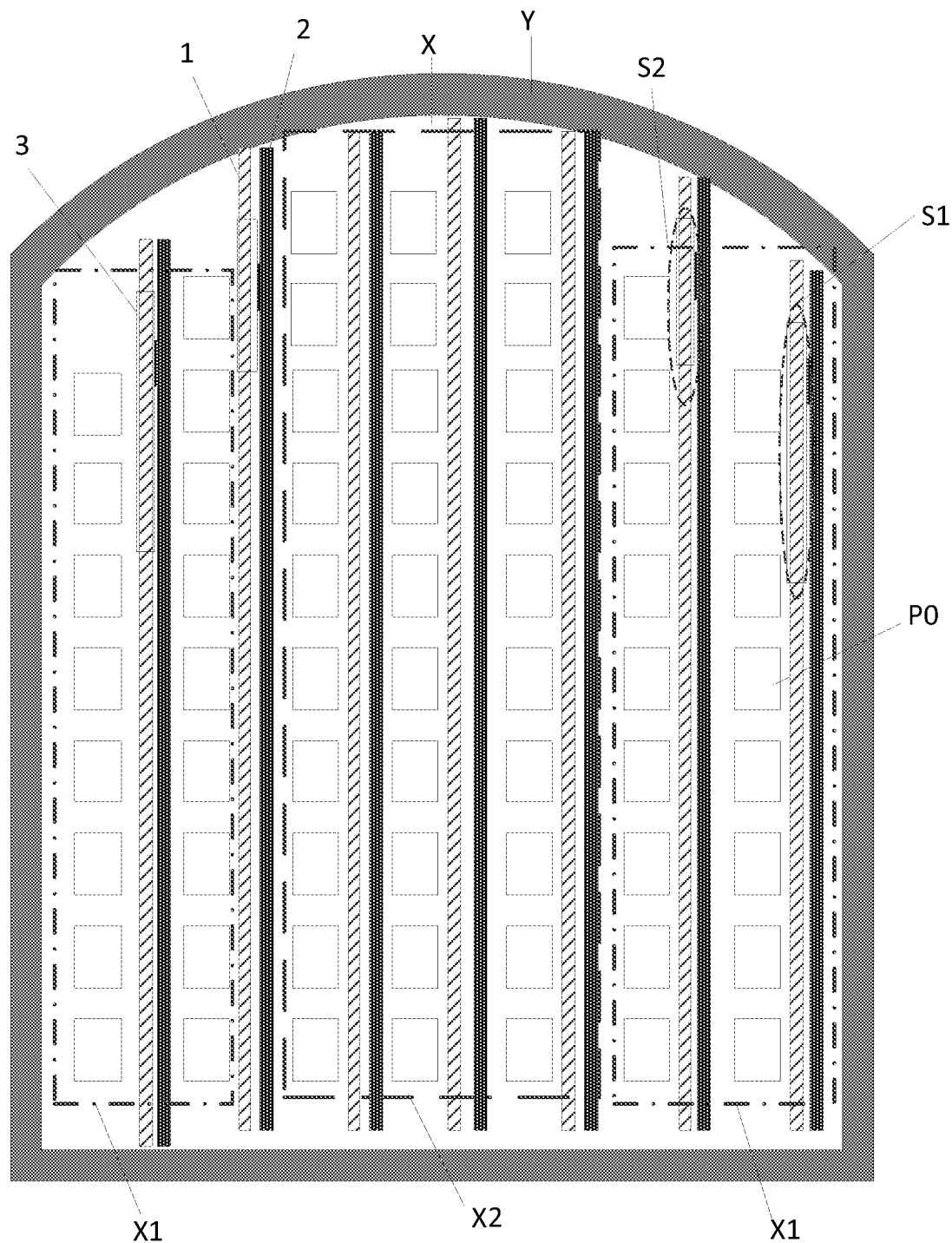
FIG. 13 is the ninth schematic diagram of the planar structure of the display panel provided in some embodiments of the present disclosure.

In one embodiment, at least part of the edge of the first display area X1 of the display panel provided in some embodiments of the present disclosure is curved. As shown in FIG. 13, the upper edge of the display area X is curved, and the columns of pixels P0 in the display area X extend to the curved edge. The curved edge can be an axisymmetric structure. The farther away the column of pixels P0 in the first display area X1 from the second display area X2 is, the fewer the number of pixels P0 in the column is.

Figure 14:
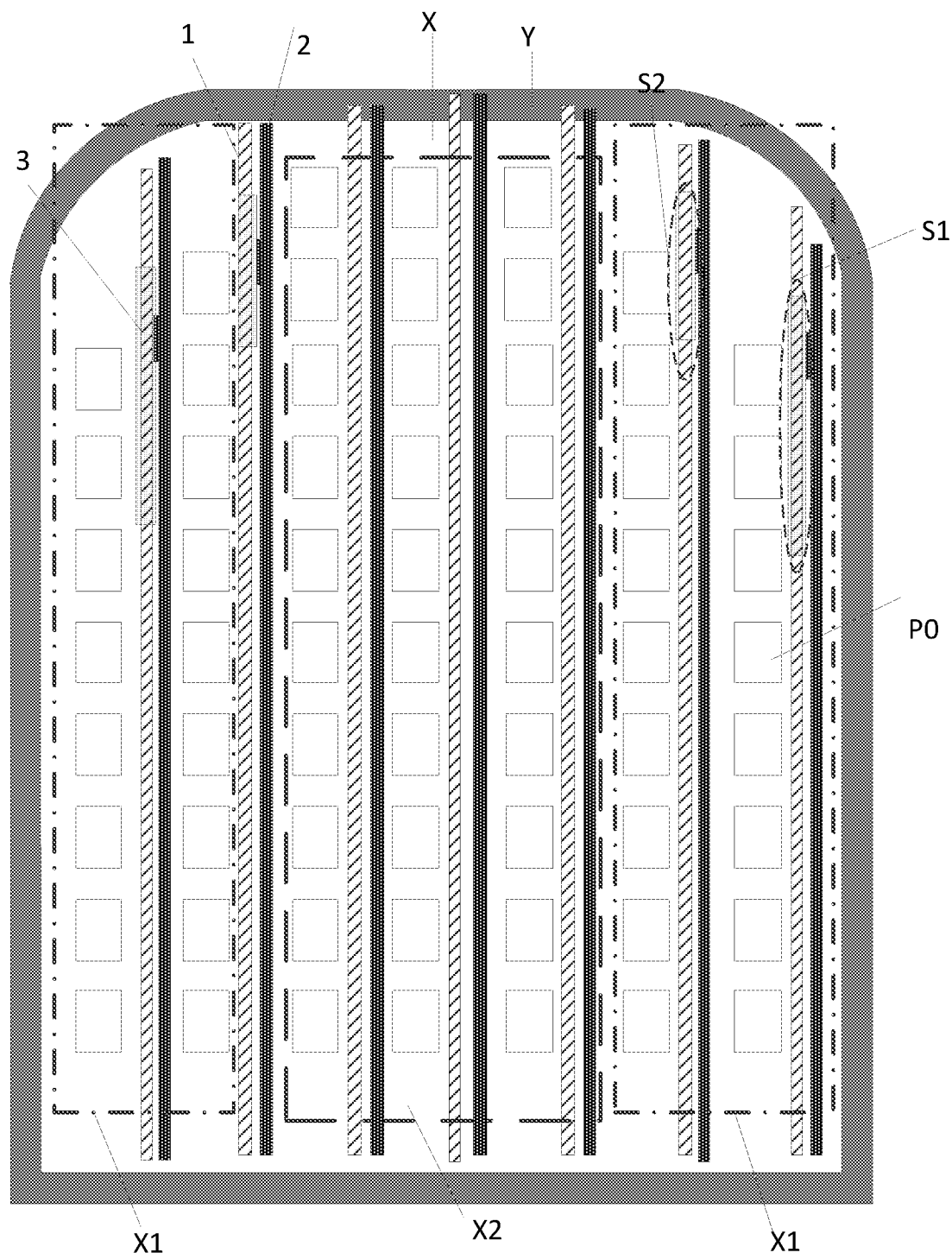
FIG. 14 is the tenth schematic diagram of the planar structure of the display panel provided in some embodiments of the present disclosure.
Figure 15:
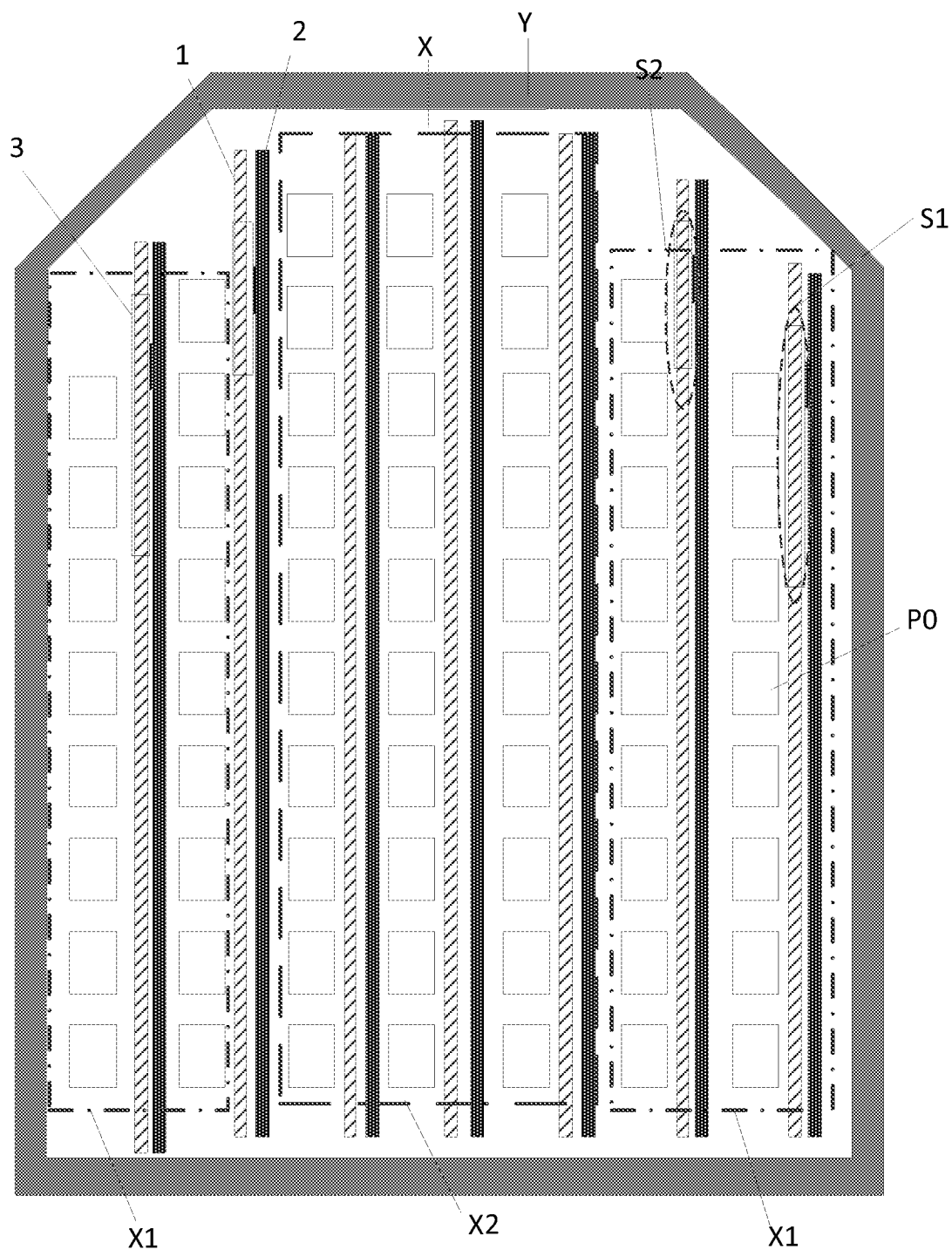
FIG. 15 is the eleventh schematic diagram of the planar structure of the display panel provided in some embodiments of the present disclosure.

In another embodiment, as shown in FIG. 14, the upper edge of the first display area X1 in the display panel provided in the embodiments of the present disclosure is curved, that is, the edge of the corner of the display panel is filleted; or, as shown in FIG. 15, in another structural schematic diagram of the display panel provided in the embodiments of the present disclosure, the edge of the display panel can also be chamfered or notched. As shown in FIG. 14 and FIG. 15, each column of pixels P0 in the first display area X1 extends to the fillet, chamfer or notch. There may be other special-shaped structures in practical applications, which are not listed here one by one.

Figure 16:
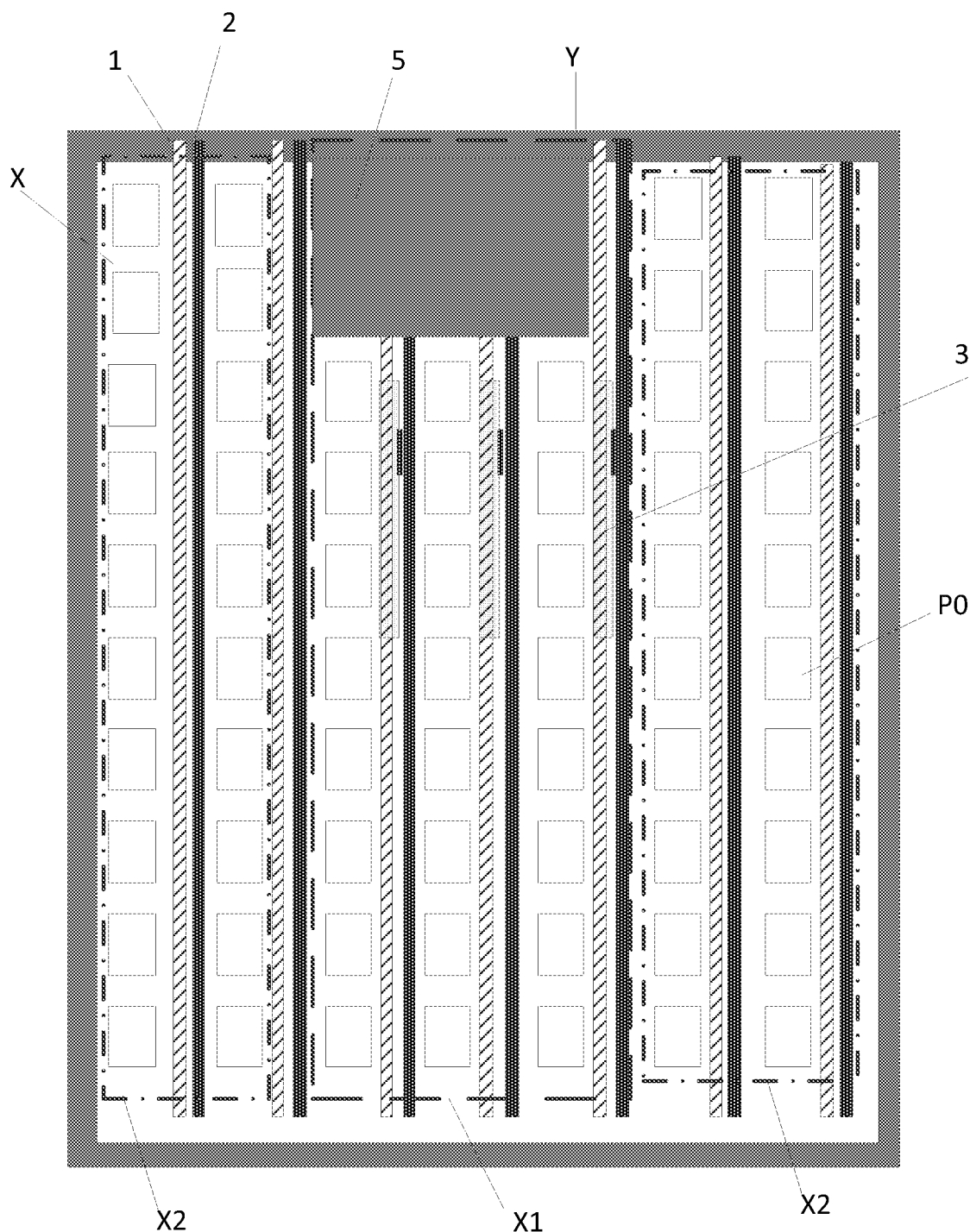
FIG. 16 is the twelfth schematic diagram of the planar structure of the display panel provided in some embodiments of the present disclosure.
Figure 17:
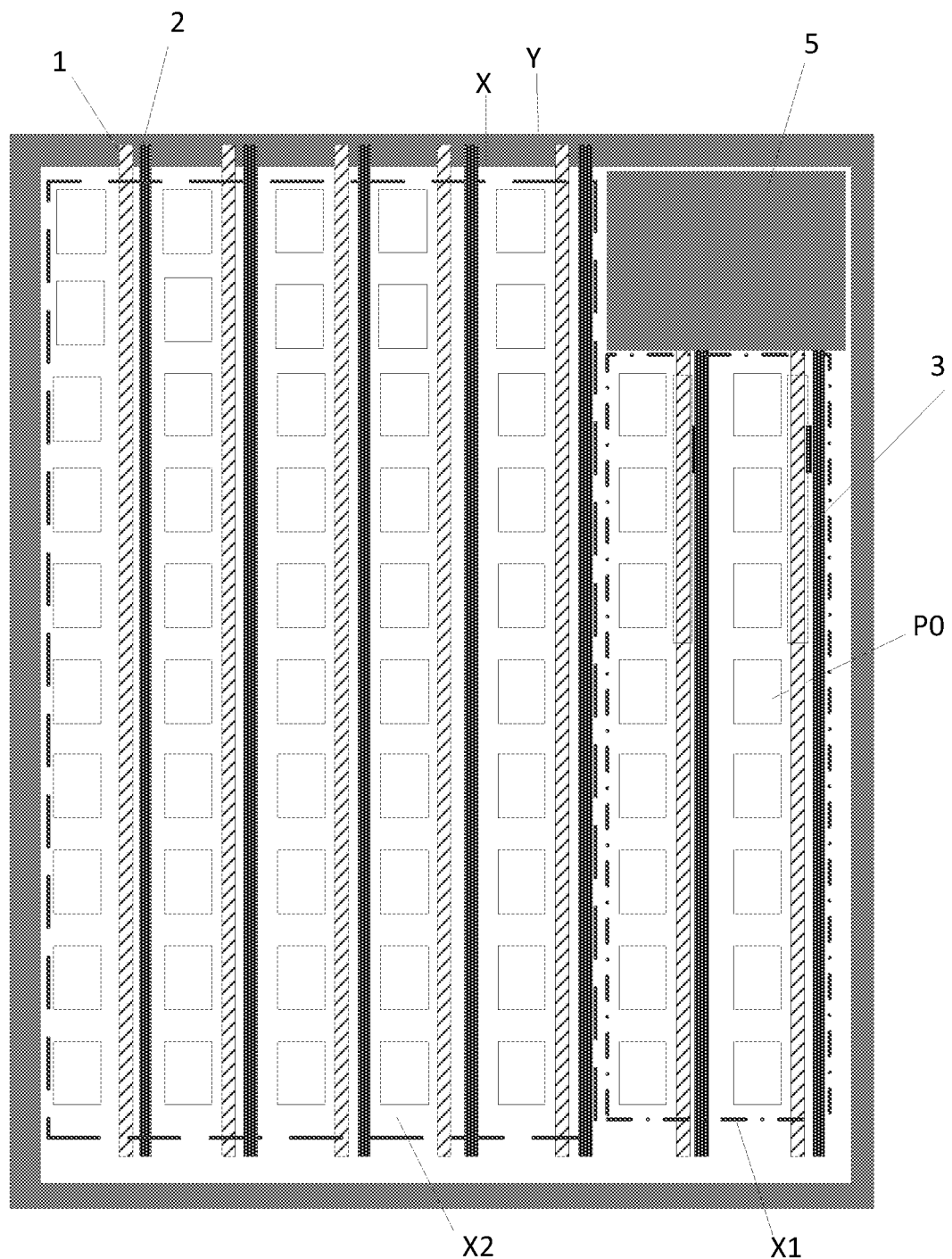
FIG. 17 is the thirteenth schematic diagram of the planar structure of the display panel provided in some embodiments of the present disclosure.

In another embodiment, as shown in FIGS. 16 and 17 of the schematic diagram of another display panel provided in the embodiments of the present disclosure, the first display area X1 may also include a notch or a hollow section 5, and the columns of pixels P0 in the first display area X1 extend to the notch or the hollow section 5. The notch or hollow section 5 can be located in the middle of the upper side of the display area X, as shown in FIG. 16, or at any top corner of the display area X, as shown in FIG. 17. The pixel P0 is not arranged at the notch or hollow section 5 while some components with other functions, such as the camera, the loudspeaker, etc., can be arranged at the notch or hollow section 5. The position of the first display area X1 is related to the location of the notch or the hollow section 5. FIGS. 16 and 17 show only two kinds of positions of the notch or the hollow section schematically. The notch or the hollow section can also be located in other positions of the display area X. The specific location is selected according to the actual cases, and there is no specific restriction here.

Figure 18:
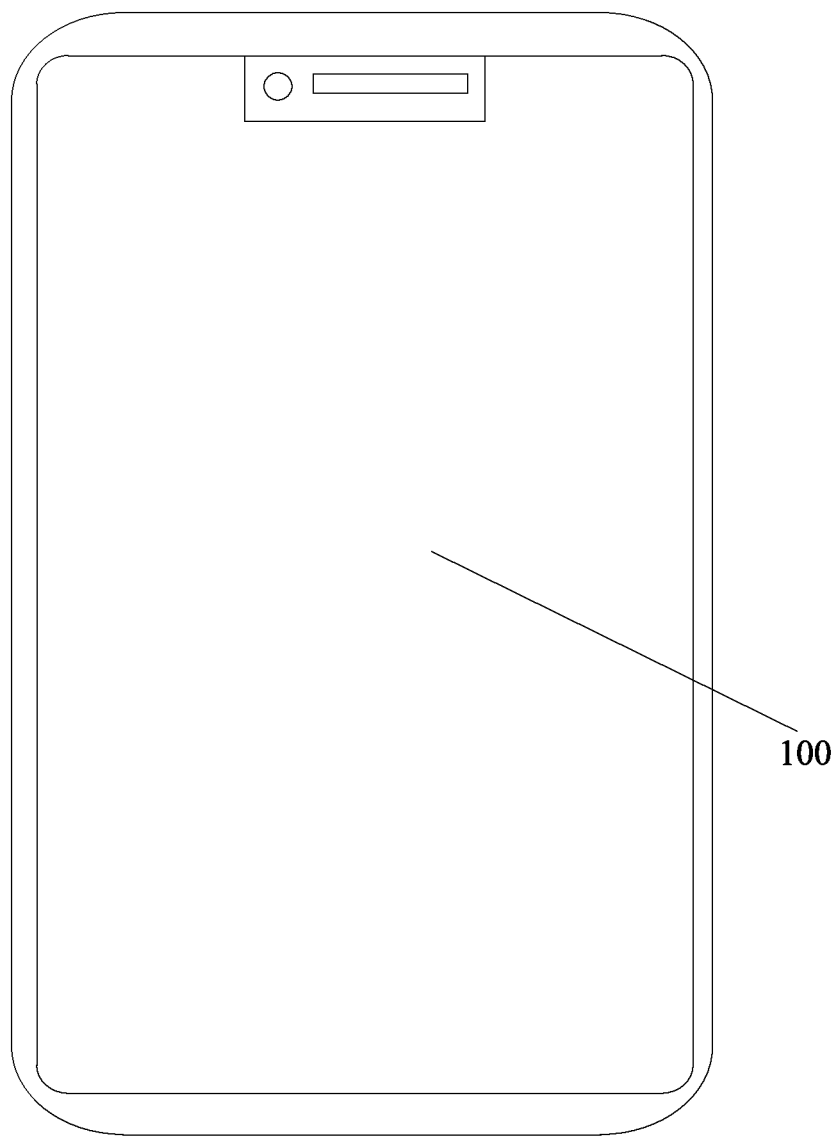
FIG. 18 is the top view of a mobile phone as the display device provided in some embodiments of the present disclosure.
Figure 19:
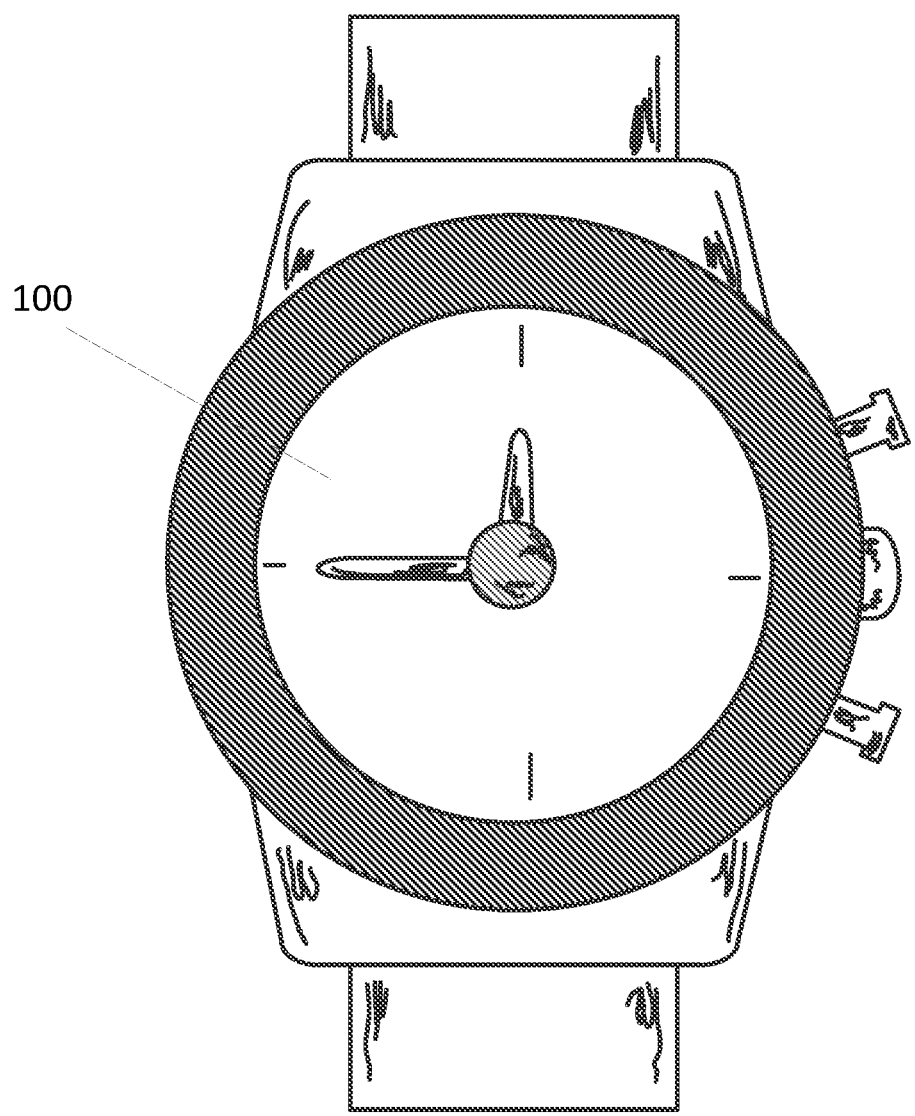
FIG. 19 is the top view of a watch as the display device provided in some embodiments of the present disclosure.

Based on the same inventive concept, embodiments of the present disclosure also provide a display device, including a display panel provided in any of the embodiments. The display device can be an LCD, an LCD TV, an Organic Light-Emitting Diode (OLED) display, an OLED TV and other display devices, as well as a mobile phone, a tablet, a notebook, a smart watch, a smart bracelet, VR/AR glasses and other mobile devices. FIG. 18 is the top view of a mobile phone as the display device provided in the embodiment of the present disclosure, and the display screen 100 can adopt the structure of any of the display panels, and there is no restriction here. FIG. 19 is the top view of a watch as the display device provided in the embodiment of the present disclosure, and the display screen 100 may adopt the structure of any of the display panels, and there is no restriction here.

Since the display device provided in the embodiment includes the display panel described in the embodiments, it also has the related advantages of the display panel accordingly. The embodiment of the display device can be referred to the embodiments of the display panel, and the repetition will not be repeated.

The embodiments of the present disclosure provide the display panel and the display device, and the display panel includes a display area and a non-display area adjacent to the display area, the display area includes: a first display area and a second display area; each of the first display area and the second display area includes a plurality of pixels arranged in array, and a plurality of data lines extending along the column direction and arranged along the row direction, and a plurality of fixed potential signal lines extending along the column direction and arranged along the row direction, with the column direction being perpendicular to the row direction; the data line and the fixed potential signal line are arranged in the same layer, and the number of pixels in each column in the first display area is less than that of pixels in any column in the second display area; the first display area also includes compensation lines, and the compensation lines and the fixed potential signal lines are electronically connected and arranged in different layers, the compensation lines and the data lines are insulated, and the compensation lines and the data lines have overlapping areas in the direction perpendicular to the direction of the display panel. By arranging compensation lines in the first display area to form the compensating capacitance between the compensation lines and the data lines in the first display area, the loads of the data lines in the first display area can be increased, load gap between the data lines in the first display area and the data lines in the second display area can be narrowed, thereby the display uniformity of the display panel and the display effect can be improved.

What is claimed is:

1. A display panel, comprising: a display area and a non-display area adjacent to the display area, wherein the display area includes: a first display area and a second display area;

the first display area and the second display area comprise a plurality of pixels arranged in an array, a plurality of data lines extending in a column direction and arranged in a row direction, and a plurality of fixed potential signal lines extending in the column direction and arranged in the row direction, with the row direction being perpendicular to the column direction; the data lines and the fixed potential signal lines are arranged in a same layer, and a quantity of pixels in each column of pixels in the first display area is less than that of pixels in any column of pixels in the second display area; and the first display area further comprises compensation lines, wherein the compensation line and the fixed potential signal lines are electrically connected and arranged in different layers, the compensation lines and the data lines are insulated from each other, and there is an overlapping area between each of the compensation lines and each of the data lines in a direction perpendicular to the display panel;

wherein the first display area comprises at least a first column of pixels and a second column of pixels with different quantity of pixels, and a quantity of pixels in the first column of pixels is less than a quantity of pixels in the second column of pixels;

there is a first overlapping area between a data line and a compensation line corresponding to the first column of pixels, and there is a second overlapping area between a data line and a compensation line corresponding to the second column of pixels; and the first overlapping area is larger than the second overlapping area.

2. The display panel of claim 1, wherein when all compensation lines in the column direction have a same length, a width of the compensation lines in the row direction in the first overlapping area is larger than that of the compensation lines in the row direction in the second overlapping area.

3. The display panel of claim 1, wherein when all compensation lines in the row direction have a same width, a length of the compensation lines in the column direction in the first overlapping area is longer than that of the compensation lines in the column direction in the second overlapping area.

4. The display panel of claim 1, wherein a width of the data line in the row direction in the first overlapping area is larger than that of the data line in the row direction in the second overlapping area.

5. The display panel of claim 3, wherein a width of the data line in a non-overlapping area is less than that of the data line in the overlapping area.

6. The display panel of the claim 1, wherein an insulating layer is arranged between a layer where the compensation lines are located and a layer where the data lines are located; and each of the compensation lines is connected with a corresponding fixed potential signal line through a through-hole in the insulating layer.

7. The display panel of the claim 1, wherein the fixed potential signal lines include a power supply voltage signal line.

8. The display panel of claim 1, wherein at least part of an edge of the first display area is a curved edge, a fillet, a chamfer or a notch, and the columns of pixels in the first display area extend to the curved edge, the fillet, the chamfer or the notch.

9. A display device, comprising the display panel in the claim 1.

10. The display device of claim 9, wherein when all compensation lines in the column direction have a same length, a width of the compensation lines in the row direction in the first overlapping area is larger than that of the compensation lines in the row direction in the second overlapping area.

11. The display device of claim 9, wherein when all compensation lines in the row direction have a same width, a length of the compensation lines in the column direction in the first overlapping area is longer than that of the compensation lines in the column direction in the second overlapping area.

12. The display device of claim 9, wherein a width of the data line in the row direction in the first overlapping area is larger than that of the data line in the row direction in the second overlapping area.

13. The display device of claim 11, wherein a width of the data line in a non-overlapping area is less than that of the data line in the overlapping area.

14. The display device of the claim 9, wherein an insulating layer is arranged between a layer where the compensation lines are located and a layer where the data lines are located; and each of the compensation lines is connected with a corresponding fixed potential signal line through a through-hole in the insulating layer.

15. The display device of the claim 9, wherein the fixed potential signal lines include a power supply voltage signal line.

16. The display device of claim 9, wherein at least part of an edge of the first display area is a curved edge, a fillet, a chamfer or a notch, and the columns of pixels in the first display area extend to the curved edge, the fillet, the chamfer or the notch.

* * * * *